United States Patent
Reboh et al.

(10) Patent No.: US 9,935,019 B2
(45) Date of Patent: Apr. 3, 2018

(54) METHOD OF FABRICATING A TRANSISTOR CHANNEL STRUCTURE WITH UNIAXIAL STRAIN

(71) Applicant: Commissariat a l'Energie Atomique et aux Energies Alternatives, Paris (FR)

(72) Inventors: Shay Reboh, Grenoble (FR); Laurent Grenouillet, Claix (FR); Frederic Milesi, Sassenage (FR); Yves Morand, Grenoble (FR); Francois Rieutord, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/261,226

(22) Filed: Sep. 9, 2016

(65) Prior Publication Data
US 2017/0076997 A1    Mar. 16, 2017

(30) Foreign Application Priority Data

Sep. 11, 2015  (FR) ..................... 15 58477

(51) Int. Cl.
*H01L 21/84* (2006.01)
*H01L 21/265* (2006.01)
(Continued)

(52) U.S. Cl.
CPC ........ *H01L 21/84* (2013.01); *H01L 21/02236* (2013.01); *H01L 21/2236* (2013.01); *H01L 21/266* (2013.01); *H01L 21/26506* (2013.01); *H01L 21/26533* (2013.01); *H01L 21/76264* (2013.01); *H01L 21/76283* (2013.01); *H01L 29/0847* (2013.01); *H01L 29/66545* (2013.01); *H01L 29/66636* (2013.01);
(Continued)

(58) Field of Classification Search
CPC ...................................... H01L 21/84
See application file for complete search history.

(56) References Cited

U.S. PATENT DOCUMENTS

| 9,431,538 B2 | 8/2016 | Reboh et al. |
| 2007/0262385 A1 | 11/2007 | Nguyen et al. |

(Continued)

OTHER PUBLICATIONS

K. Cheng et al., "High Performance Extremely Thin SOI (ETSOI) Hybrid CMOS with Si Channel NFET and Strained SiGe Channel PFET", 2012, IEEE, 4 pages.*

(Continued)

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

Method for creation of stressed channel structure transistors wherein at least one amorphizing ion implantation of the surface layer of a substrate of the semiconductor-on-insulator type is carried out through openings in a mask, so as to render zones of the surface layers amorphous and to induce relaxation of a zone intended to form a channel and located between the zones that have been rendered amorphous, the relaxation being carried out in a direction orthogonal to that in which it is intended that the channel current flows.

10 Claims, 8 Drawing Sheets

(51) Int. Cl.
  *H01L 21/762* (2006.01)
  *H01L 29/08* (2006.01)
  *H01L 29/66* (2006.01)
  *H01L 29/78* (2006.01)
  *H01L 21/266* (2006.01)
  *H01L 21/02* (2006.01)
  *H01L 21/223* (2006.01)
  *H01L 21/8238* (2006.01)

(52) U.S. Cl.
  CPC .... *H01L 29/66772* (2013.01); *H01L 29/7842* (2013.01); *H01L 29/7846* (2013.01); *H01L 21/02255* (2013.01); *H01L 21/823814* (2013.01); *H01L 21/823828* (2013.01); *H01L 21/823878* (2013.01)

(56) References Cited

U.S. PATENT DOCUMENTS

| | | |
|---|---|---|
| 2008/0124858 A1 | 5/2008 | Nguyen et al. |
| 2008/0128748 A1* | 6/2008 | Iinuma .............. H01L 21/76232 257/190 |
| 2008/0171426 A1 | 7/2008 | Ren et al. |
| 2009/0079026 A1* | 3/2009 | Zhu ................... H01L 29/1025 257/510 |
| 2011/0101456 A1 | 5/2011 | Hoentschel et al. |
| 2013/0337637 A1 | 12/2013 | Cheng et al. |
| 2014/0225160 A1* | 8/2014 | Clifton .............. H01L 29/7849 257/190 |
| 2015/0097241 A1 | 4/2015 | Rideau et al. |
| 2015/0118824 A1* | 4/2015 | Rideau ................... H01L 21/84 438/435 |
| 2017/0062438 A1* | 3/2017 | Moll ................. H01L 27/1104 |

OTHER PUBLICATIONS

K. Cheng, et al., "High Performance Extremely Thin SOI (ETSOI) Hybrid CMOS with Si Channel NFET and Strained SiGe Channel PFET", IEEE, 2012, 4 pgs.
French Preliminary Search Report dated Jul. 7, 2016 in French Application 15 58477 filed on Sep. 11, 2015 (with English Translation of Categories of Cited Documents).
U.S. Appl. No. 12/296,250, filed Apr. 6, 2007, 2009/0162991 A1, Remi Beneyton, et al.
U.S. Appl. No. 14/555,897, filed Nov. 28, 2014, 2015/0155170 A1, Shay Reboh, et al.
U.S. Appl. No. 14/575,329, filed Dec. 18, 2014, 2015/0179474 A1, Sylvain Maitrejean, et al.
U.S. Appl. No. 14/579,069, filed Dec. 22, 2014, 2015/0179665 A1, Shay Reboh, et al.
U.S. Appl. No. 14/719,580, filed May 22, 2015, 2015/0338720 A1, Laurent Grenouillet, et al.
U.S. Appl. No. 14/791,713, filed Jul. 6, 2015, 2016/0005862 A1, Shay Reboh, et al.
U.S. Appl. No. 14/849,060, filed Sep. 9, 2015, 2016/0071933 A1, Sylvain Maitrejean, et al.
U.S. Appl. No. 14/859,427, filed Sep. 21, 2015, 2016/093507 A1, Issam Ouerghi, et al.
U.S. Appl. No. 14/782,190, filed Apr. 3, 2013, 2016/0035843 A1, Maud Vinet, et al.
U.S. Appl. No. 14/950,416, filed Nov. 24, 2015, 2016/0149039 A1, Shay Reboh, et al.
U.S. Appl. No. 14/976,958, filed Dec. 21, 2015, 2016/0181155 A1, Fabien Deprat, et al.
U.S. Appl. No. 15/049,468, filed Feb. 22, 2016, 2016/0254362 A1, Sylvain Maitrejean, et al.
U.S. Appl. No. 15/070,781, filed Mar. 15, 2016, Unknown.
U.S. Appl. No. 15/092,002, filed Apr. 6, 2016, Unknown.

* cited by examiner

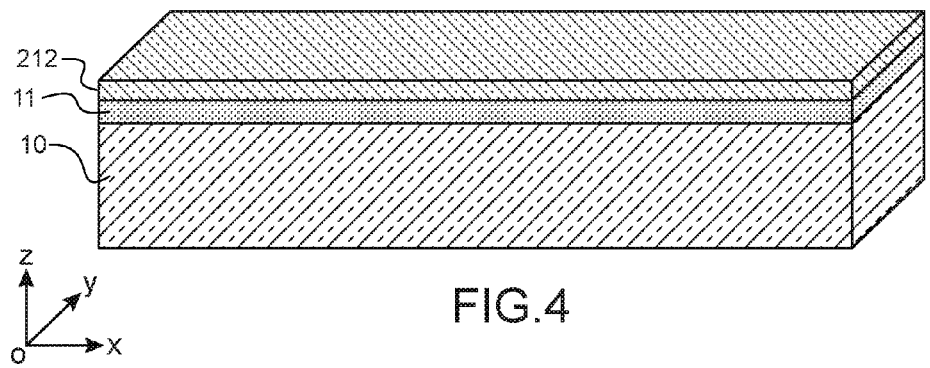
FIG.4
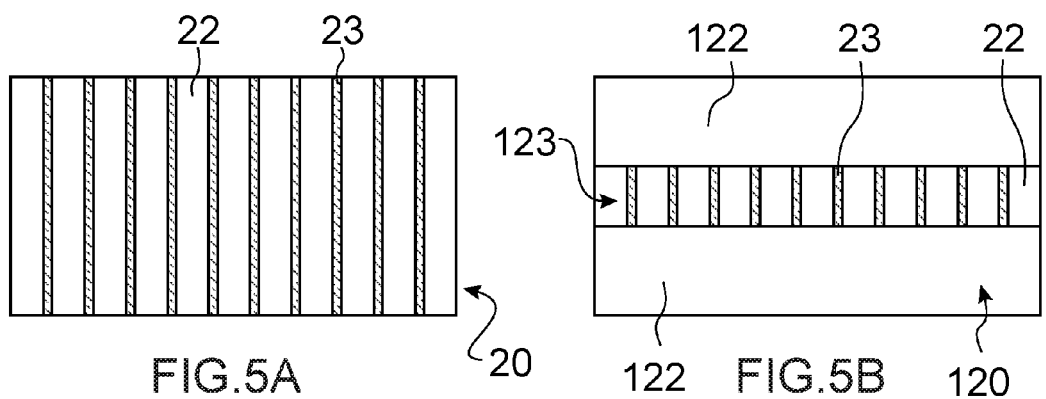
FIG.5A
FIG.5B
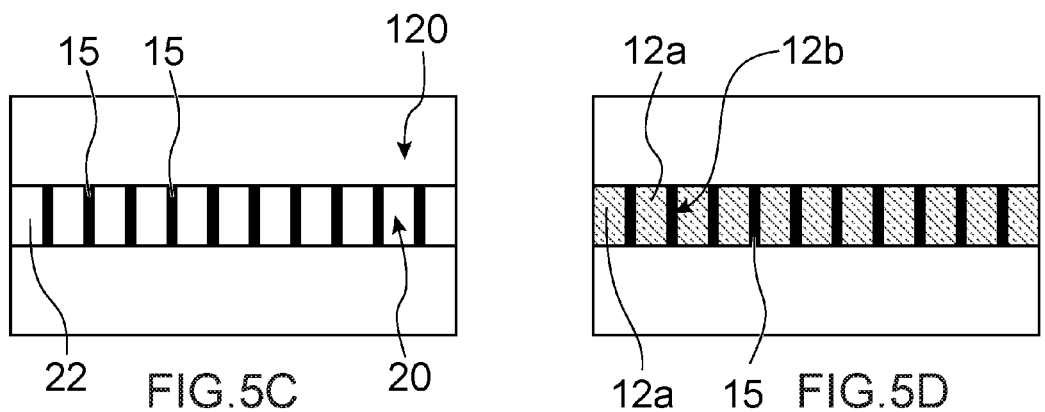
FIG.5C
FIG.5D

METHOD OF FABRICATING A TRANSISTOR CHANNEL STRUCTURE WITH UNIAXIAL STRAIN

DISCLOSURE

Technical Field and Prior Art

The present disclosure relates to the field of transistor structures, and more specifically those equipped with a channel zone which undergoes deformation or mechanical stress.

The term mechanical deformation refers to a material which has its crystal lattice parameters) extended or shortened.

In the case where the deformed lattice parameter is greater than the so-called "natural" parameter of a crystalline material, the latter is said to be experiencing deformation tensile When the deformed lattice parameter is smaller than the natural lattice parameter, the material is said to be experiencing compressive deformation, or be under compression.

Mechanical stress states are associated with these mechanical deformation states. Nevertheless it is also common for these deformation states to be known as mechanical stress states. In the remainder of the present application, this concept of deformation or "strain" will be designated in a generic manner by the term "stress".

A stress applied to a semiconductor material induces a change in the crystal lattice and therefore of its band structure, as a result of which the mobility of the carriers in this material is modified.

The mobility of the electrons is increased (respectively decreased) by a tensile stress (respectively compressive) of the semiconductor material wherein they pass, whereas the mobility of holes will be increased (respectively decreased) when the semiconductor is compressive (respectively tensile).

Transistors can be made on a stressed semiconductor surface layer of an insulating semiconductor type substrate. The stress in this surface layer is generally a biaxial stress.

In order to improve the performance of a stressed channel transistor, it may be desirable to relax the stress in a direction orthogonal to that in which the channel extends, in other words, in a direction that is orthogonal to the direction in which the transistor current is intended to flow.

Such relaxation can be achieved by etching of the lateral edges of a channel structure made of stressed semiconductor material.

The problem arises of finding a new method for making a stressed semiconductor structure device.

DESCRIPTION OF THE INVENTION

One embodiment of the present invention provides a method for manufacturing stressed channel structure transistor(s) comprising the following steps:

formation of a mask on a surface layer of a semiconductor-on-insulator type substrate comprising a support layer, an insulating layer separating the support layer from the surface layer, the surface layer being based on a semiconductor material stressed under a biaxial stress, the mask comprising at least one block of elongated form arranged on a first zone of the surface layer, this first zone having a length $L_1$ measured parallel to a first direction and a width $W_1$ measured parallel to a second direction, the first zone being capable of forming a transistor channel structure wherein a current is meant to pass in the first direction, the mask being configured such that one or several openings of elongated form and which extend parallel to the first direction are arranged on either side of the mask block and respectively reveal the second zones of the surface layer arranged on either side of the first zone, execution of at least one ion implantation of the surface layer through the openings in the mask, so as to render the second zones amorphous and to induce relaxation of the first zone in the second direction.

With such a method a channel structure can be obtained based on a material stressed in a first direction parallel to that in which the channel current is meant to flow and relaxed in a second dimension orthogonal to the first direction, without necessarily creating topography or relief in the surface layer of the substrate.

The mask may be formed of several distinct parallel mask blocks, separated two abreast by an opening.

Thus several first semiconductor zones can be relaxed in a direction parallel to that in which the width of these zones is measured.

The method may furthermore comprise a step consisting of transforming the second zones of the surface layer revealed by the openings in the mask into insulating zones.

The transformation of the second zones that have been rendered amorphous into insulating zones means that a uniaxial stress is achieved in a first semiconductor zone whilst at the same time creating a lateral insulation of this first semiconductor zone.

According to one implementation possibility, this transformation of the second zones into insulating zones may be achieved using at least one implantation step.

Advantageously, the amorphisation of the second zones and the transformation of the second zones into insulating zones may be carried out simultaneously by implantation.

According to one implementation possibility, the transformation of the second zones into insulating zones comprises at least one thermal oxidation step.

According to one implementation possibility, one or more of the insulating zones formed by transformation of the second amorphous zones is envisaged so as to achieve a separation with one or more other transistors.

In order to increase the relaxation effect of the first zones and after transformation of the second zones into insulating zones, a thickness of these insulating zones may be removed.

According to one implementation possibility, after amorphisation of the second zones of the surface layer, the method may comprise steps for:

removal of the mask, then formation of at least one transistor gate on the first semiconductor zone, then growth, on the semiconductor material of the surface layer, of source and drain blocks on either side of the gate.

According to another implementation possibility wherein the mask is a first mask, the method may furthermore comprise, after formation of the first mask and prior to the amorphisation of the second zones, a step for:

formation of a second mask resting on the first mask and arranged facing given regions of the surface layer, the second mask comprising an opening revealing the first mask, then after amorphisation of the second zones, steps for:

removal of a portion of the first mask through the opening of the second mask, formation of a transistor gate in the opening of the second mask, removal of the second mask and of remaining portions of the first mask, then, formation of source and drain blocks on either side of the gate.

According to another implementation possibility, prior to the formation of the mask, the following steps are carried out:

formation of a sacrificial gate, then, formation of source and drain blocks on either side of the sacrificial gate, removal of the sacrificial gate so as to leave room for an opening between the source and drain blocks, then, after formation of the mask in the opening and amorphisation of the second zones of the surface layer, a gate is formed in the opening provided between the source and drain blocks.

According to one implementation possibility the mask used during the amorphisation step may have an intrinsic stress.

Another embodiment of the present invention provides for a transistor formed using a method as defined above.

Another embodiment of the present invention provides for a transistor on a semiconductor-on-insulator type substrate comprising a surface layer wherein a channel structure is formed, the surface layer comprising one or more first extended semiconductor zones with a semiconductor material base, the semiconductor material being stressed in a first given direction taken parallel to the length of the first zones, the semiconductor material being relaxed in a second direction taken parallel to the width of the first zones, the surface layer comprising furthermore second zones arranged on either side of the first zone and extending parallel to the first direction, the second zones being amorphous semiconductor material based or being based on the nitride and/or oxide of the semiconductor material.

BRIEF DESCRIPTION OF THE ILLUSTRATIONS

The present invention will be better understood on reading the description of example embodiments given, purely as an indication and in no sense restrictively, making reference to the appended illustrations in which:

FIG. 4 shows an example of a possible starting substrate for a method according to the invention;

FIGS. 5A-5G show an embodiment example of the "gate first" type wherein the relaxation of the channel structure in a direction orthogonal to that in which the current is intended to flow is carried out in a localised region in which a transistor gate is envisaged;

Figure 9A:
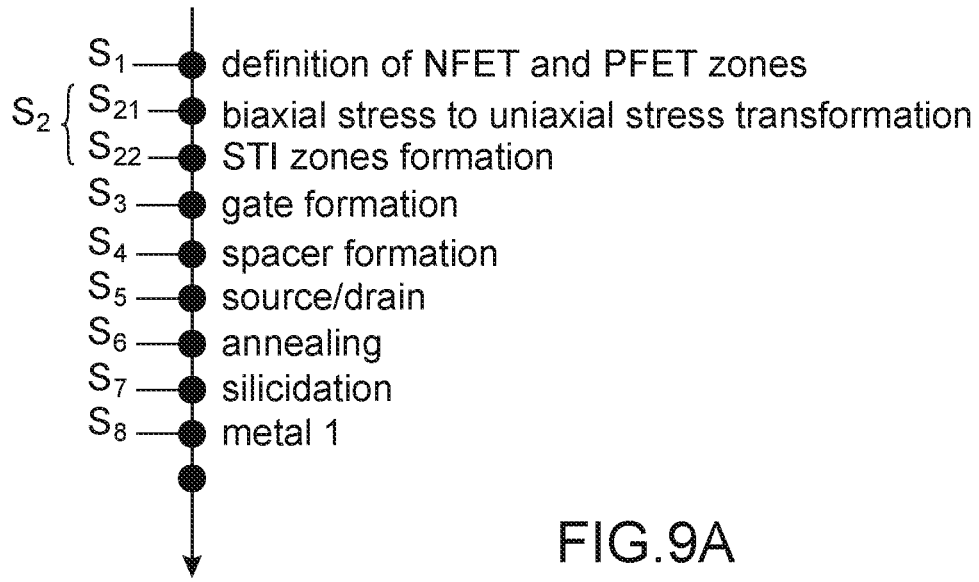
Figure 9B:
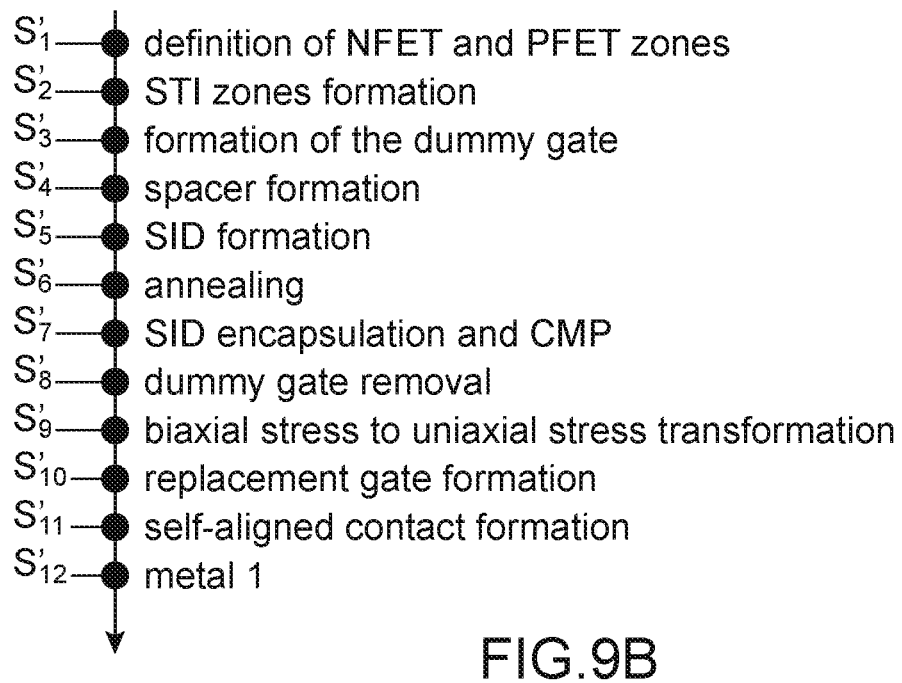

FIGS. 9A and 9B give example of chains of steps for methods for manufacturing stressed channel transistor devices with a uniaxial stress;

Identical, similar or equivalent portions of the various figures have the same numerical references, to make it easier to go from one figure to another.

In order to make the figures more readable, the various parts shown in the figures are not necessarily shown at a uniform scale.

Furthermore, in the description hereafter, terms which depend on the orientation, such as "under", "on", "surface", "lateral" etc. for a structure are applied assuming that the structure is oriented in the manner shown in the figures.

DETAILED DESCRIPTION OF PARTICULAR EMBODIMENTS

One example of a method for producing a stressed channel structure transistor will now be described in relation to FIGS. 1A-1G.

The starting material in this method may be a stressed semiconductor-on-insulator type substrate, and thus may comprise a semiconductor support layer 10, an insulating layer 11 located on and in contact with the support layer 10, as well as a so-called "surface" semiconductor layer 12 which comprises an intrinsic stress, and which is located on and in contact with the insulating layer 11.

Figure 1A:
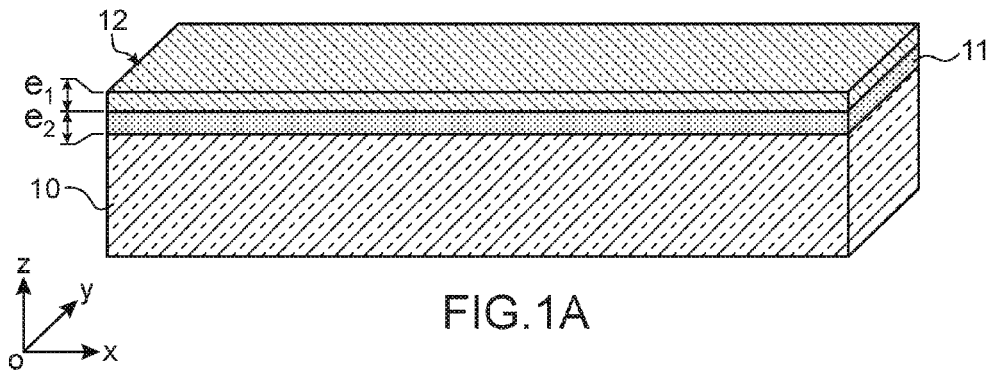
FIGS. 1A-1G show an example of a method according to one embodiment of the invention, wherein a stressed channel structure is relaxed in a direction orthogonal to that in which the channel current is intended to flow.

An example of a stressed silicon on insulator type substrate is the sSOI ("strained silicon on insulator") substrate wherein the surface semiconductor layer 12 is based on Si that is stressed in particular under tension with a biaxial stress (FIG. 1A).

The transistor created may use, for example, FDSOI ("Fully Depleted Silicon on Insulator") technology. In this case the surface semiconductor layer 12 has a thickness $e_1$ which may be for example between 3 and 20 nm, whereas the insulating layer 11 commonly called BOX ("Buried Oxide") and which is $SiO_2$ based may have a thickness $e_2$ for example between 5 nm and 145 nm (the thicknesses $e_1$ and $e_2$ being dimensions measured parallel to the z axis of an orthogonal reference [O; x; y; z] shown in FIG. 1A).

A mask 20 is then formed on the stressed surface layer 12. The mask 20 may be a hard mask, for example SiN or $SiO_2$ based.

Figure 1B:
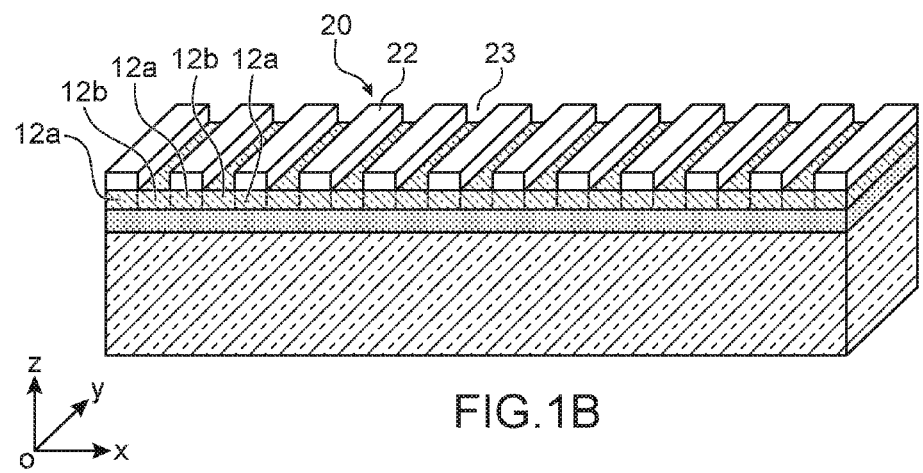

In the embodiment example shown in FIG. 1B, the mask 20 is formed of several blocks 22 arranged respectively on the first zones 12a of the surface layer 12. The mask blocks 22 have an oblong or elongated shape, advantageously a parallelepiped shape. The term "elongated" means that they have a width (measured parallel to the x axis of the reference [O; x; y; z]) less than and in particular 3 times smaller than their length (itself measured parallel to the y axis of the reference [O; x; y; z]). The mask blocks 22 may be envisaged with a width for example of between 5 nm and 50 nm and a length for example of between 100 nm and 10 μm.

The mask comprises openings 23 revealing, respectively, the second zones 12b of the surface layer 12. The openings 23 also have an oblong or elongated shape, for example a rectangular shape, and extend on either side of the blocks 22 of the mask 20, alongside the latter.

The first zones 12a of the surface layer located respectively opposite the mask blocks thus have an elongated shape. Then amorphisation is performed on the second zones 12b of the surface layer 12 revealed by the openings 23 of the mask 20. This amorphisation is performed using one of more ion implantations, the blocks 22 of the mask 20 protecting the first zones 12a of the surface layer on which they rest. The implanted species may be for example Si or Ge or As.

The amorphising implantation may be executed for example based on atoms of Ge, or of Si, or of As, or of C, or, of Ar, or of P, or of N, at an energy chosen according to the nature of the implanted species, the nature and thickness of the surface layer, of the implantation current density and of the temperature of the substrate during implantation. In order to render amorphous a layer of 10 nm to 30 nm of Si or of SiGe, an implantation of Si or of Ge can be carried out using an energy of between 6 keV and 40 keV and using a dose between 5e14 and 1e15 atoms/cm$^2$.

For example, in order to render amorphous a thickness of 15 nm of Si, Si ions can be implanted at an energy of between 6 keV and 8 keV with a dose of the order of $1 \times 10^{15}$ atoms/cm$^2$. In order to render amorphous a thickness of 30 nm of Si, Si ions can be implanted for example at an energy of between 14 keV and 25 keV with a dose of the order of $5 \times 10^{14}$ atoms cm$^2$.

Thus, the second zones 12b of the surface layer 12, which extends against the first zones 12a of the non-implanted surface layer and whose crystalline structure is preserved, are rendered amorphous. The amorphisation of the second zones 12b leads to a relaxation of the stress in the second zones 12b in a direction which is orthogonal to that in which the first zones and the second zones extend, this direction also being parallel to the principal plane of the surface layer 12. The term "principal plane" of the surface layer 12 here means a plane passing through the surface layer 12 and which is parallel to a plane [O; x; y] of the orthogonal reference [O; x; y; z].

Due to the shape of the first zones 12a and to their arrangement in relation to the second zones 12b which are joined adjacent to them, the amorphisation also induces a relaxation of the stress in the first zones 12a in the direction in which the first zones 12a extend.

Figure 1C:
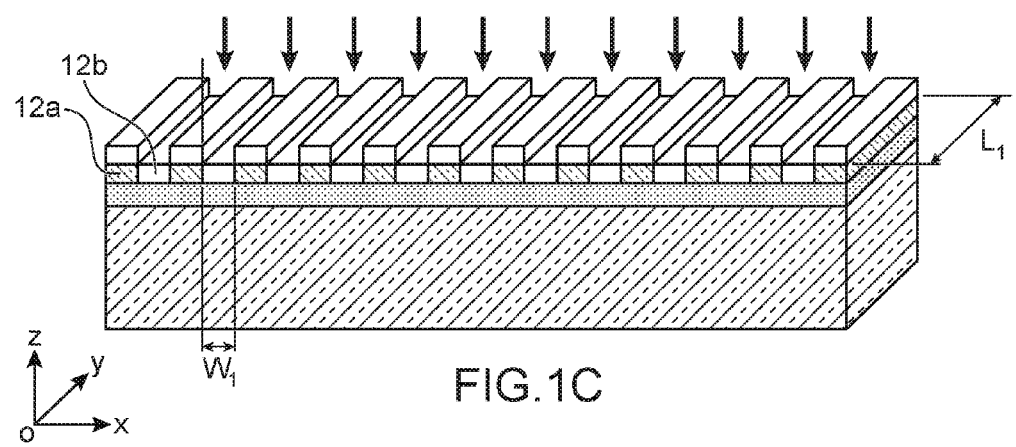

In the example in FIG. 1C, the direction in which the relaxation occurs is parallel to the direction in which the width $W_1$ of the first semiconductor zones 12a is measured. In other words, relaxation in a direction parallel to the x axis of the orthogonal reference [O; x; y; x] is performed.

A stress is however preserved in the first zones 12a in another direction which corresponds to the direction in which the first zones 12a extend, that is, in a direction taken parallel to the length $L_1$ of the first semiconductor zones 12a. In other words, a stress is preserved in a direction taken parallel to the y axis of the orthogonal reference [O; x; y];

The relaxation may thus be realised without etching of the surface layer, in other words, without creating a relief. This may facilitate the creation of a transistor gate later. For a given thickness $e_1$ of the surface layer 10, $L_1$ is preferably envisaged as being greater than $10 \times e_1$, and $W_1$ preferably less than $5 \times e_1$.

These first zones 12a are meant to form a transistor channel structure. A current is meant to pass in this channel parallel to the first direction, in other words, parallel to the y axis in FIG. 1C. By implementing a relaxation in the second direction, that is, a direction orthogonal to that in which it is intended to pass a current, the performance of the channel structure in terms of carrier mobility is improved.

In order to allow the first zones 12a to further relax in the second direction, the mask 20 itself may be based on a material which has an intrinsic stress which is opposite to that of the surface layer 12. For example, in order to allow the first zones 12a based on Si and stressed under tension to relax, a compressive mask, for example SiN based, may be used. In another case, for example, where the first zones 12a are compression stressed SiGe based, a mask based on tension stressed SiN may be used.

Figure 1D:
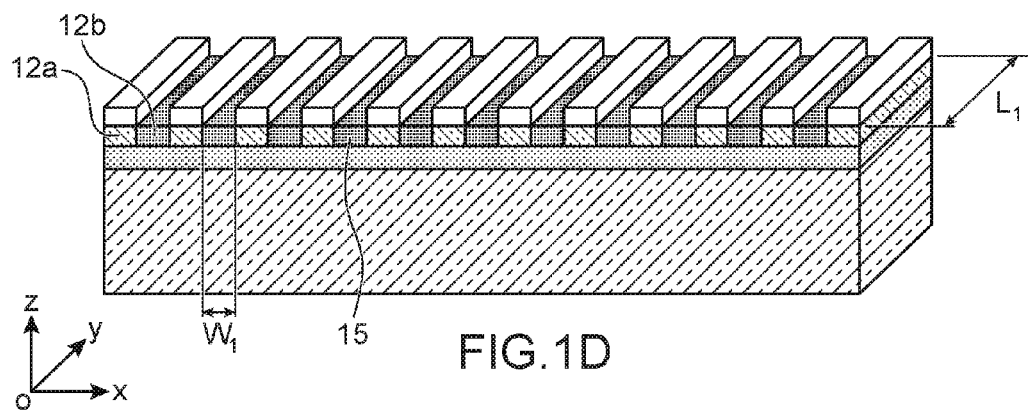

The second semiconductor zones 12b can then be transformed into insulating zones 15 (FIG. 1D). The transformation of the second semiconductor zones 12b which have been rendered amorphous, into insulating zones on either side of a first semiconductor zone 12a allows the implementation of a lateral insulation of this first semiconductor zone.

Preferably, this transformation is achieved by using the mask 20, which acts as protection of the first semiconductor zones 12a. Thus, using the same mask, a uniaxial stress can be created in the surface layer 12 and insulating zones 15 can be formed in this same surface layer 12.

The transformation of the second zones 12b into insulating zones 15 can be achieved for example using one of more implantations, once more using the mask 20 as an implementation mask.

For example, oxygen may be implanted in order to transform the second semiconductor zones 12b into semiconductor oxide zones, in particular silicon oxide.

Alternatively, nitrogen could be implanted in order to transform the second semiconductor zones 12b into nitride zones, in particular silicon nitride zones.

Another alternative embodiment envisages an implantation of oxygen and of nitrogen. The implantation method used may be of the Plasma Immersion Ion Implantation (PIII) type, followed if necessary by high-temperature short-duration annealing. The implantation may be carried out at a temperature between for example 200° C. and 500° C., Subsequent to the implantation, thermal annealing may be carried out in order to improve the quality of the dielectric material obtained.

Such annealing may be carried out for example at a high temperature between 300° C. and 1100° C. and preferably for a short duration, for example between several minutes at low temperature and several µs at high temperature.

Thermal annealing may also be envisaged in order to remove any defects created during the implantation in the insulating layer 11 and/or at an interface between dielectric material and semiconductor material.

Another method for transformation of the second semiconductor zones 12b into zones of dielectric material 15 may comprise oxidation of the second zones 12b in order to create a semiconductor oxide in the second zones 12b. In this case the mask 20 is envisaged so as to create an oxidation mask which protects the first semiconductor zones 12a. The oxidation may be achieved for example using plasma or by thermal oxidation. Nitriding using plasma may also be carried out.

Figure 1E:
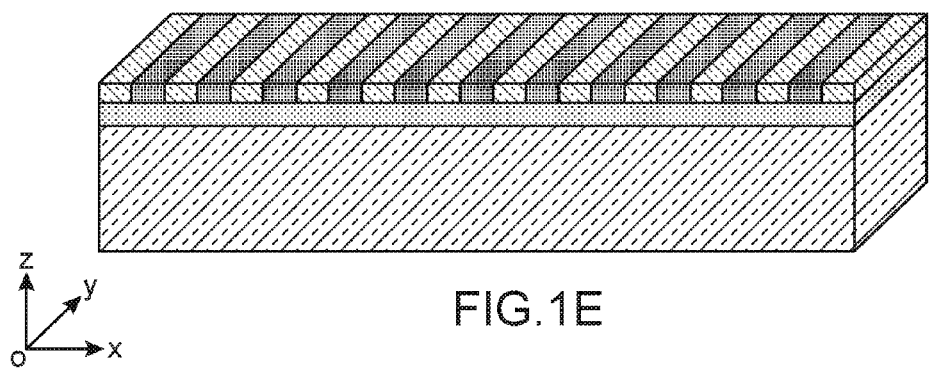

A removal of the mask 20 is then carried out (FIG. 1E).

In the case of the mask 20 being based on dielectric materials, this material is preferably different from that of the insulating zones 15, and envisaged in particular so as to allow selective removal of this mask 20 without altering the insulating zones 15. In one case, for example, where the insulating zones 15 of the surface layer are silicon oxide based, the mask 20 may have been envisaged for example as being silicon nitride based. In another case, for example, where the insulating zones 15 are silicon nitride based, the mask 20 may have been envisaged as being silicon oxide based.

After having removed the mask 20, planarisation may then be carried out, for example by CMP polishing.

Then a gate 30 for the transistor is formed. In order to do this a gate stack is deposited comprising a dielectric and agate material, which is then etched in order to form a gate pattern. The gate 30 created is arranged on the first zones 12a and extends orthogonally to the first semiconductor zones 12a taken in the direction of their length Thus in the example shown in FIG. 1E, the gate 30 extends in a direction parallel to the x axis of the orthogonal reference [O; x; y; z].

Figure 1F:
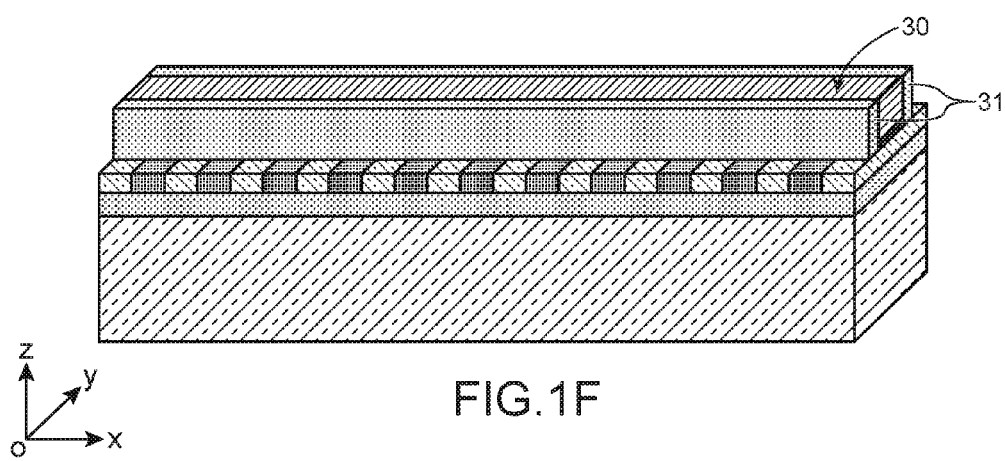
Figure 1G:
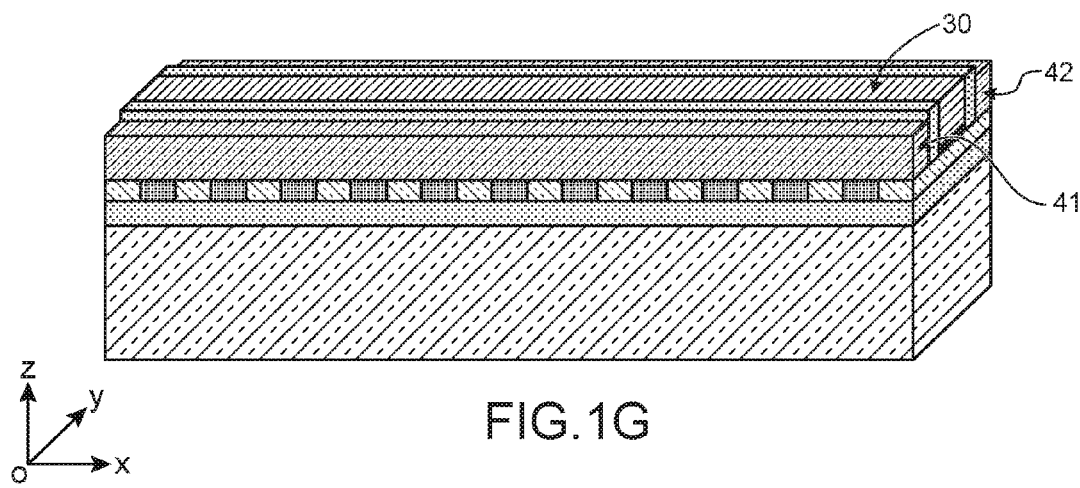

Insulating spacers 31 are then formed on either side of the gate (FIG. 1F).

Source and drain blocks 41, 42 are then made either side of the gate, by carrying out epitaxial growth on regions of the first semiconductor zones 12a.

The material of the source and drain blocks may be envisaged so as to optimise the uniaxial stress preserved in the first semiconductor zones 12a. In the case where the transistor made is of the PMOS type, the source and drain regions 41, 42 may for example be SiGe based. In another case for example where the transistor made is of the NMOS type, the source and drain blocks 41, 42 may for example be carbon doped Si (Si:C) based.

Figure 2:
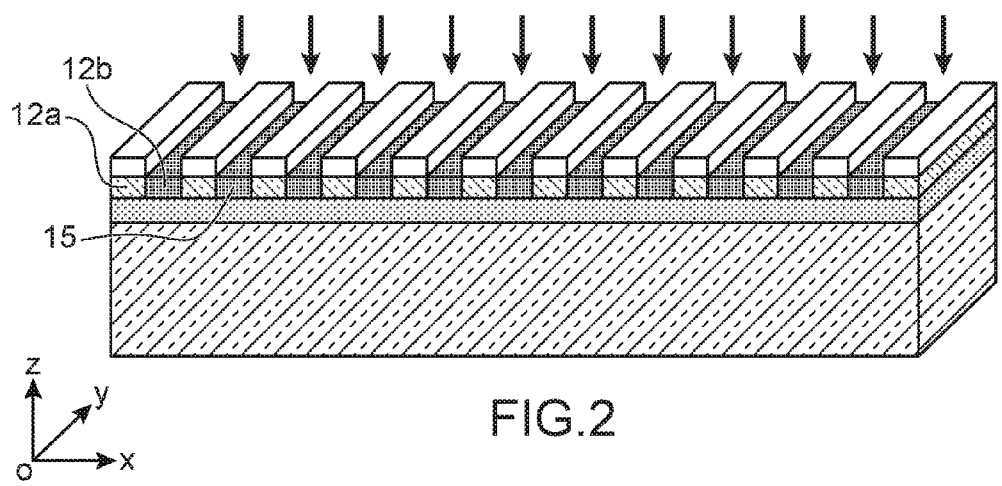
FIG. 2 shows an implantation step for the simultaneous implementation of a transformation of amorphous semiconductor zones into insulating zones and the relaxation of stress in a semiconductor zone located between these insulating zones in a direction orthogonal to that along which this semiconductor zone extends.

An alternative of the previously described example method is shown in FIG. 2 and advantageously envisages the concomitant execution of amorphisation of the second zones 12b leading to the relaxation of the first zones 12a, and the transformation of the second zones into dielectric zones, using at least one common implantation step. This implantation of the second zones 12b may be carried out using for example N or O. The energy and the dose are altered depending on the materials and the thickness of the target. In particular plasma immersion implantation PIII may be carried out, a technique which allows implantation at high doses to be carried out over a reasonable time. For example PIII implantation of oxygen using an energy of the order of 1 keV and a dose of the order of $1^e17$ atoms/cm$^2$ can be used to transform a layer of Si with a thickness $e_1$ less than 8 nm into oxide.

According to another example, PIII implantation of oxygen using a dose of the order of $1^e17$ atoms/cm$^2$ at an energy of 2.44 keV can be used to transform a layer of Si with a thickness e1<15 nm into oxide.

According to another example, in order to carry out nitriding of a layer of Si of less than 10 nm, nitrogen implantation at a dose between $6.10^{16}$ and $1*10^{17}$ cm$^{-2}$ and at a voltage of 2400 V allows a layer of nitride to be formed.

These implantations are preferably followed by high temperature annealing, for example annealing of the type commonly called "spike" annealing of very short duration at 950° C.

Figure 3:
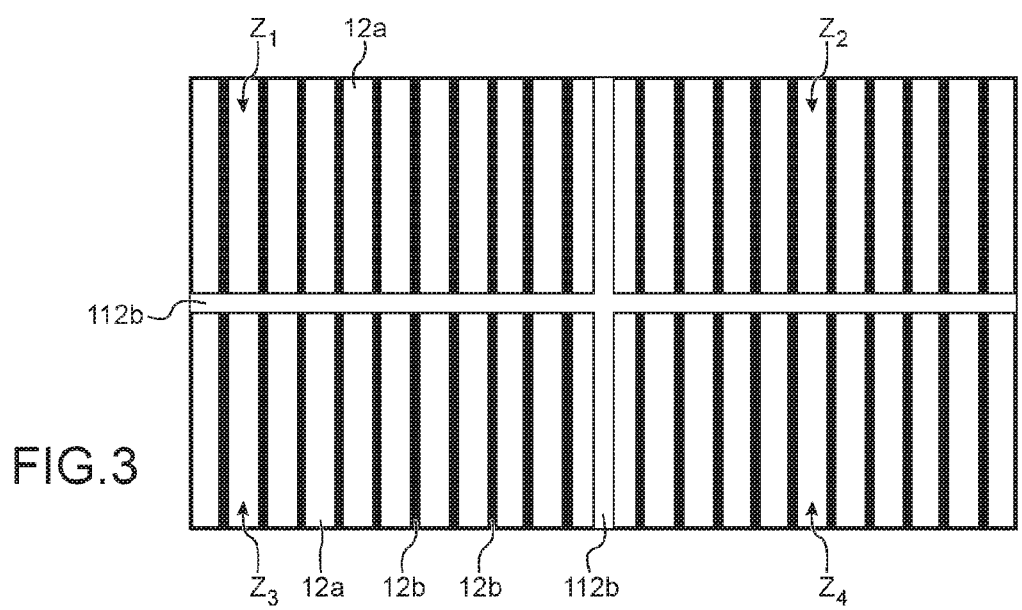
FIG. 3 shows an embodiment example wherein the semiconductor zones transformed into insulating zones serve to define one or more insulating outlines which separate and mark the extent of the active transistor zones.

According to one implementation possibility for one or other of the method examples previously described, during the steps described in relation to the FIGS. 1C-1D or FIG. 2, some zones 112b of the surface layer 12 which are rendered amorphous and then transformed into insulated zones may be intended to form an insulating separation outline between active zones Z1, Z2, Z3, Z4 or transistor zones of the surface layer 12 (FIG. 3). Thus, whilst relaxing the first zones 12a of the surface layer, Shallow Trench isolation (STI) is achieved.

Another alternative of one or other of the previously described method examples envisages beginning with a stressed semiconductor-on-insulator substrate, this time of the sSiGeOI (strained silicon germanium on insulator) type. Such a substrate thus possesses a surface semiconductor layer 212 based on biaxial compression stressed SiGe (FIG. 3).

In this case the amorphisation of the second semiconductor zones 12b of the surface layer 212 is used to relax the compressive stress in a direction that is orthogonal to the direction of elongation of the first semiconductor zones whose crystalline structure has been preserved, whilst preserving a compressive stress in the direction of elongation of the first semiconductor zones 12a.

An example of a method for forming a layer of stressed SiGe on insulator may comprise the deposition of a layer of SiGe or of a stack of a thin layer of Si and of a layer of SiGe on the surface layer of stressed Si of a sSOI substrate, then carrying out oxidation so as to enrich the stressed surface layer of Si with Germanium. The oxide is then removed.

A method for relaxation of biaxial stress by amorphisation as described previously can be carried out on a substrate comprising a region appropriate for the implementation of N-type transistors and which comprises a biaxial stress under tension and another region appropriate for the implementation of P type transistors and comprising a compression biaxial stress.

Such a substrate may for example be a sSOI substrate which has a surface layer based on tension stressed Si, a region of which is transformed into cSiGe by a Germanium enrichment method as referred to previously.

For example the relaxation by amorphisation method described previously in relation to FIG. 1C in a region of the surface layer 12 reserved for N type transistors may be carried out whilst totally masking another region of the surface layer 12 reserved for P type transistors.

Then, after having removed the mask this other region is transformed into a cSiGe region by Germanium enrichment.

According to another alternative, a method as previously described in relation to FIG. 1C in which zones of the stressed surface layer of a semiconductor on insulator substrate is rendered amorphous may also be carried out only in a localised region of the surface layer 12 on which it is intended to make the gate. This avoids modifying the regions of the surface layer in which and/or on which it is intended to form the source and drain blocks. Such an alternative is shown in FIGS. 5A-5G.

After having formed a first mask 20 (the creation of which has been previously described in relation to the FIG. 1B and which is shown in FIG. 5A as a top view), a second masking 120 is carried out. The second mask 120 may be based on the same material as that of the first mask 20, for example of SIN or of SiO$_2$.

This second mask 120 comprises blocks 122 arranged opposite the respective locations of a source region and of a drain region of the transistor which are to be made. An opening 123 made between the blocks 122 of the second mask defines a location for the transistor gate that it is intended to form later. This opening 123 thus reveals the blocks 22 of the first mask 20 and the openings 23 envisaged on either side of the blocks 22 of the first mask 23 (FIG. 5B).

Then at least one ion implementation is carried out so as to render amorphous the second zones 12b of the surface layer 12 which are revealed by the openings 23 of the first mask 20, themselves revealed by the opening 123 of the second mask 120.

After having thus relaxed the stress in the first zones 12a in a direction orthogonal to that in which they extend, the second zones 12b which are rendered amorphous can be transformed into insulating zones. In order to do this, for example, implantation is carried out through the openings 23 and 123 of the first mask 20 and of the second mask 120 (FIG. 5C).

Then a portion of the first mask 20 located at the bottom of the opening 123 is then removed. Thus the first zones 12a of the surface layer 12 under uniaxial stress and the second zones 12b of the surface layer 12 transformed into insulating zones are revealed (FIG. 5D).

In the case of the masks 20 and 120 being based on the same material, then in order to allow the removal of a portion of the first mask 20 whilst preserving sufficient of the second mask 120, the latter could be envisaged with a thickness greater than that of the blocks of the first mask 20.

Figure 5E:
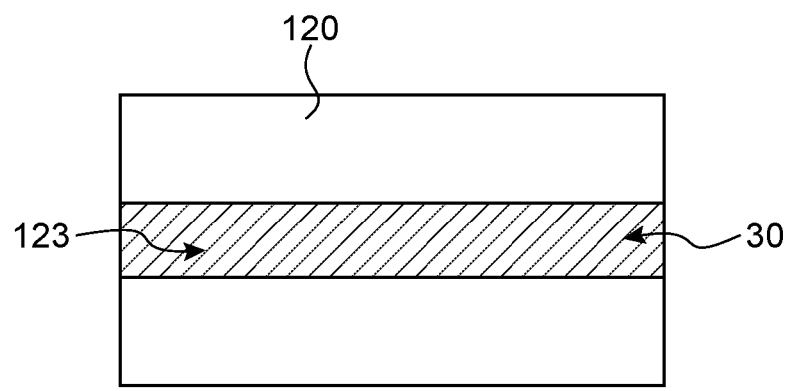

Then, a gate 30 is formed in the opening 123 of the second mask 120 (FIG. 5E).

Figure 5F:
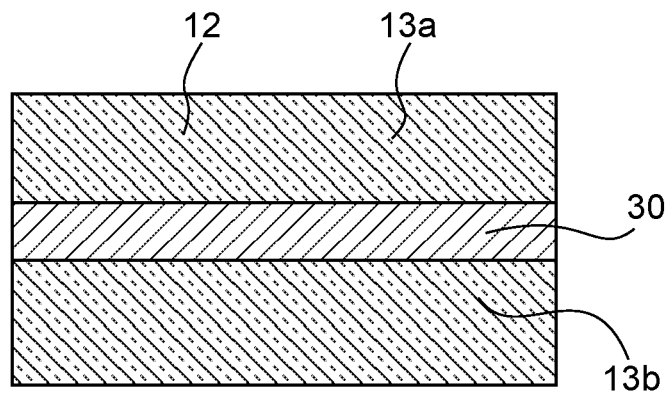

The second mask 120 is then removed so as to reveal the regions 13a, 13b of the surface layer 12 in which and/or on which it is intended to form the source and drain blocks (FIG. 5F).

Figure 5G:
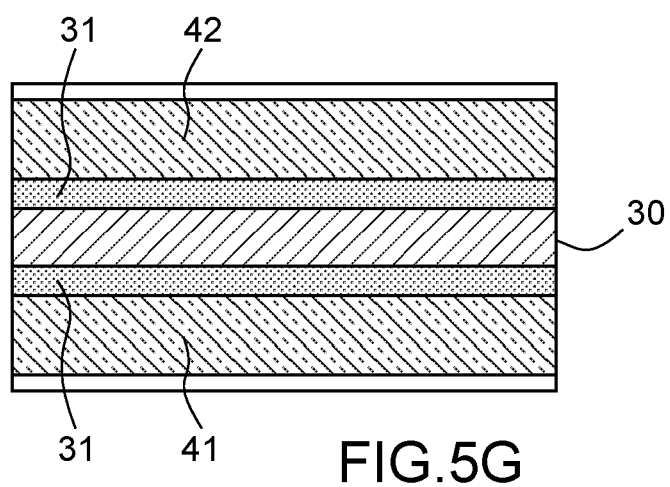

Then, insulating spacers 31 are formed against the lateral flanks of the gate 30. Source and drain blocks are then formed by epitaxy (FIG. 5G).

With the embodiment example that has just been given, the creation of the source and drain blocks is easier that that described in FIGS. 1A-1G. In effect, it is only done on the regions 13a, 13b of the semiconductor material.

In the examples of methods that have just been described, the gate is made before the source and drain blocks are formed. As an alternative to these methods of a type which may be called "gate first", source and drain blocks can be made by using a sacrificial gate then replacing this sacrificial gate having beforehand transformed the biaxial stress into a uniaxial stress in the first zones 12a of the surface layer 12.

One such method alternative, of a type that may be called "gate last" is shown in FIGS. 6A-6D.

In this example a sacrificial gate 230 is formed on the biaxial stressed surface layer 12 and insulating spacers 31 are formed against the flanks of the sacrificial gate 230. The sacrificial gate may be for example polysilicon based.

Figure 6C:
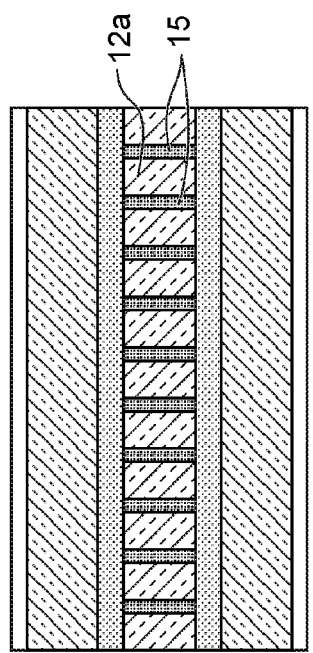
FIGS. 6A-6D show an embodiment example of a "gate last type" used to implement the relaxation of a semiconductor zone located between source and drain blocks.
Figure 6D:
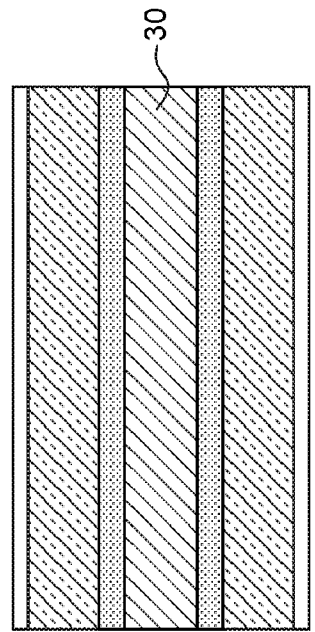
Figure 6A:
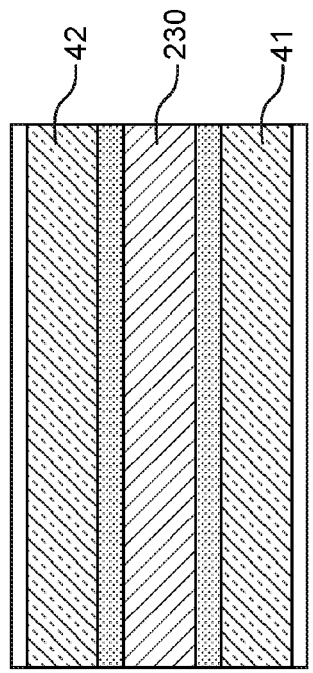

Then source and drain blocks 41, 42 are made on either side of the sacrificial gate 230 (FIG. 6A).

Figure 6B:
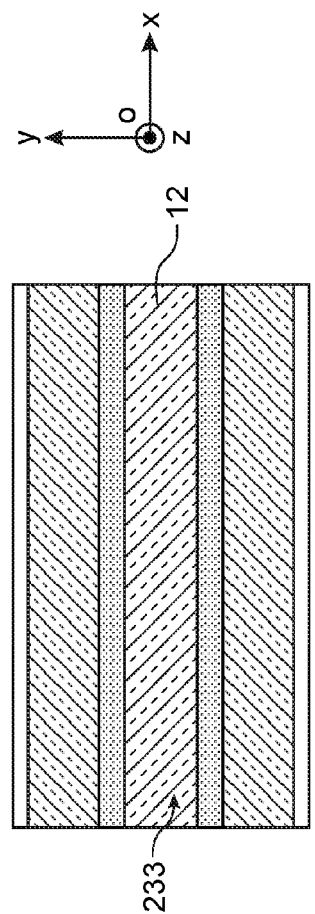

The sacrificial gate 230 is then removed. The location of the sacrificial gate left vacant forms an opening 233 which reveals the surface layer 12 of the substrate (FIG. 6B).

In this opening 233 the mask 20 is then formed as described previously in relation to FIG. 1B, and comprises parallel blocks 22 arranged respectively on the first zones 12a of the surface layer 12 with parallel openings envisaged between the blocks 22 of the mask 20 and revealing second zones 12b of the surface layer 12.

Through the opening 233 between the source and drain blocks and the openings 23 of the mask 20, amorphisation of the second zones 12b is thus carried out so as to transform the biaxial stress into uniaxial stress in the first zones 12a. The second semiconductor zones 12b are also transformed into insulating zones 15 (FIG. 6D).

Then a replacement gate 30 is formed in the opening 233 (FIG. 6D).

Figure 7:
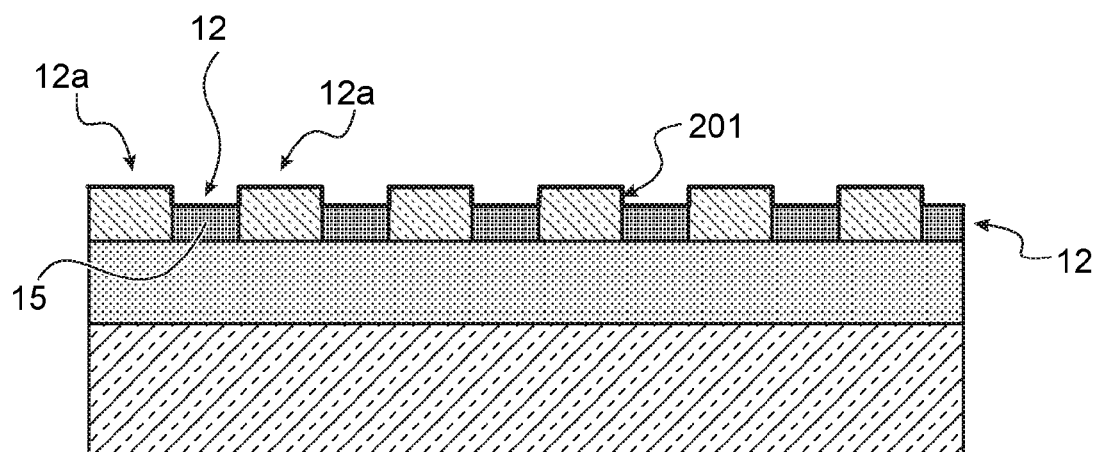
FIG. 7 shows an example of a method wherein a thickness is removed from the surface layer zones of a substrate transformed into insulating zones.

A method that allows the stress in the first semiconductor zones 12a to be increased and more particularly in a direction parallel to their length $L_1$ is shown in FIG. 7. In order to do this, a given thickness of the second zones 12b of the surface layer 12 is removed after these zones 12b have been transformed into zones 12b of dielectric material 15. Thus a portion of the lateral flanks 201 of the first semiconductor zones 12a is revealed.

The thickness removed may be for example between 2 nm and 15 nm.

Figure 8:
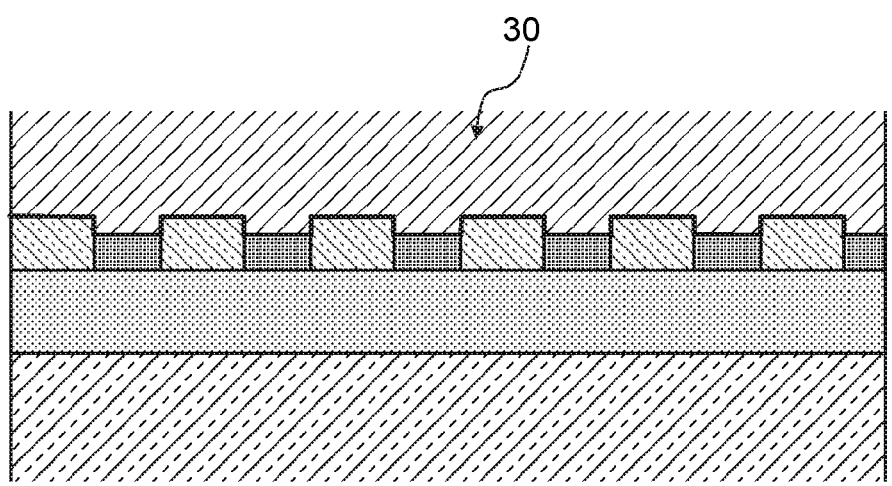
FIG. 8 shows an example of a method wherein a gate is formed on the lateral flanks of a channel structure.

A gate 30 can then be formed whose shape matches the shape of the first semiconductor zones 12a. This gate is thus arranged against a portion of the lateral flanks 201 of the first semiconductor zones 12a. Such a gate arrangement shown in FIG. 8 allows improved control of the channel. The gate 30 may be made as in the method example described previously in relation to FIGS. 6A-6D. Thus, the gate 30 can be formed as a replacement of a sacrificial gate and implemented using an inlay method wherein an opening in a mask is filled in.

A particular example of a chain of steps for manufacturing a microelectronic transistor device which includes an amorphisation step for transforming a biaxial stress into a uniaxial stress is given in FIG. 9A.

The method is, in this example, of the "gate first" type.

First of all step S1) zones reserved for WET and PFET transistors are defined in the surface layer of the biaxial stressed substrate.

Then (step S21) the transformation of the biaxial stress into uniaxial stress is carried out as described previously, by amorphisation of zones of the surface layer.

Amorphous zones are transformed into dielectric zones, which allow STI isolation zones to be formed (step S22, where this step S22 and S21 can be combined and carried out as a single step S2).

Then a gate is formed (step S3), then spacers (step S4). Then source and drain regions are made (step S5), and annealing is carried out(step 56).

Then a silicidation and contact creation step (step S7) is carried out.

Then a first metal interconnection level can be formed (step S8).

Another particular example of a chain of steps for manufacturing a microelectronic transistor device which includes an amorphisation step for transforming a biaxial stress into a uniaxial stress is given in FIG. 9B.

The method in this other example is of the "gate last" type. First of all (step S'1) zones reserved for NFET and PFET transistors are defined in the surface layer of the biaxial stressed substrate. Then (step S'21) STI insulation zones are formed. Then a dummy gate (step S'3) is formed, then spacers (step S'4). Then source and drain regions are made (step S'5), and annealing (step S'6).

Then a step for encapsulation of source and drain regions and CMP polishing are carried out (step S'7).

The dummy gate is then removed (step S'8). Then the transformation of the biaxial stress into uniaxial stress is carried out by amorphisation of zones of the surface layer (step S'9).

Then the replacement gate is formed (step S'10), then self-aligned contacts (step S'11). Then a first metal interconnection level can be formed (step S'12).

A method according to one or other of the method examples described above can be adapted to the creation of channel structure transistors which are not necessarily planar. For example, transistors of the uniaxial stressed channel finFET type may be made.

The invention claimed is:

1. A method for creating stressed channel structure transistors comprising:
   forming a mask on a surface layer of a semiconductor-on-insulator type substrate comprising a support layer, an insulating layer separating the support layer from the surface layer, the surface layer being based on a semiconductor material stressed with a biaxial stress, the mask being formed of plural blocks of elongated form arranged respectively on first zones of the surface layer, the first zones having a length measured parallel to a first direction and a width measured parallel to a second direction, said second direction being orthogonal to said first direction, the mask being configured such that several openings of elongated form and which extend parallel to the first direction are arranged on either side of the masking blocks and respectively reveal second zones of the surface layer arranged on either side of the first zones,
   implanting of the surface layer through the openings in the mask, rendering the second zones amorphous and inducing relaxation of the first zone in the second direction by the implanting, and
   after amorphisation of the second zones of the surface layer,
      removing the mask, then
      forming at least one transistor gate extending parallel to the second direction,
      growing, on the surface layer, a source block and a drain block on either side of the transistor gate,
   the method further comprising: transforming the second zones of the surface layer revealed by the openings of the mask into insulating zones,
   wherein said gate is arranged on plural first zones and plural second zones, wherein said source block is arranged on said plural first zones and said plural second zones, said plural first zones being configured to form a transistor channel structure.

2. The method according to claim 1 wherein the transformation of the second zones into insulating zones is achieved using at least one implantation step.

3. The method according to claim 2, wherein the amorphisation of the second zones and the transformation of the second zones into insulating zones are carried out concomitantly by implantation.

4. The method according to claim 2 wherein the transformation of the second zones into insulating zones comprises at least one thermal oxidation step.

5. The method according to claim 1, wherein at least one insulating zone formed by transformation of the second zones, forms a separation with another transistor.

6. The method according to claim 1 wherein, after transformation of the second zones that have been rendered amorphous into insulating zones, a thickness of these insulating zones is removed.

7. The method according to claim 1, wherein the mask has an intrinsic stress.

8. A method for creating stressed channel structure transistors, said method comprising:
   forming a mask on a surface layer of a semiconductor-on-insulator type substrate comprising a support layer, an insulating layer separating the support layer from the surface layer, the surface layer being based on a semiconductor material stressed with a biaxial stress, the mask being formed from at least one block of elongated form arranged on a first zone of the surface layer, the first zone having a length measured parallel to a first direction and a width measured parallel to a second direction, the first zone being capable of forming a transistor channel structure wherein a current is meant to pass in the first direction, the mask being configured such that one or several openings of elongated form and which extend parallel to the first direction are arranged on either side of the masking block and respectively reveal the second zones of the surface layer arranged on either side of the first zone,
   executing at least one ion implantation of the surface layer through the openings in the mask, so as to render the second zones amorphous and to induce relaxation of the first zone in the second direction,
   transforming the second zones of the surface layer revealed by the openings of the mask into insulating zones,
   wherein the mask is a first mask, the method further comprising, after forming the first mask and prior to the amorphisation of the second zones, forming a second mask resting on the first mask and arranged opposite given regions of the surface layer, the second mask comprising an opening revealing the first mask, then after amorphisation of the second zones:
   removing a portion of the first mask through the opening of the second mask,
   forming a gate in the opening of the second mask,
   removing the second mask and of remaining portions of the first mask, then,
   forming source and drain blocks on either side of the gate.

9. A method for creating stressed channel structure transistors, said method comprising:
   forming a mask on a surface layer of a semiconductor-on-insulator type substrate comprising a support layer, an insulating layer separating the support layer from the surface layer, the surface layer being based on a semiconductor material stressed with a biaxial stress, the mask being formed from at least one block of elongated form arranged on a first zone of the surface layer, the first zone having a length measured parallel to a first direction and a width measured parallel to a second direction, the first zone being capable of forming a transistor channel structure wherein a current is meant to pass in the first direction, the mask being configured such that one or several openings of elongated form and which extend parallel to the first direction are arranged on either side of the masking block and respectively reveal the second zones of the surface layer arranged on either side of the first zone,
   executing at least one ion implantation of the surface layer through the openings in the mask, so as to render the second zones amorphous and to induce relaxation of the first zone in the second direction,
   transforming the second zones of the surface layer revealed by the openings of the mask into insulating zones,
   wherein, prior to the formation of the mask, the following steps are carried out:
   forming a sacrificial gate on the surface layer, then,
   forming source and drain blocks on either side of the sacrificial gate,
   removing the sacrificial gate so as to leave room for an opening between the source and drain blocks,
   then, after forming the mask in the opening and amorphisation of the second zones of the surface layer, a gate is formed in the opening between the source and drain blocks.

10. The method according to claim 1, wherein
the removing the mask includes revealing the surface layer including the first zones and the second zones,
the forming the at least one transistor gate includes forming the at least one transistor gate on the surface layer, the at least one transistor gate having an elongated dimension in the second direction, and
the growing the source block and the drain block includes growing the source block and the drain block on either side of the transistor gate in the first direction.

* * * * *